United States Patent
Inoue

(10) Patent No.: US 10,418,503 B2
(45) Date of Patent: Sep. 17, 2019

(54) SOLAR BATTERY MODULE AND METHOD FOR MANUFACTURING SOLAR BATTERY MODULE

(71) Applicant: MITSUBISHI ELECTRIC CORPORATION, Chiyoda-ku, Tokyo (JP)

(72) Inventor: Yosuke Inoue, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 40 days.

(21) Appl. No.: 15/569,160

(22) PCT Filed: Jul. 14, 2015

(86) PCT No.: PCT/JP2015/070189
§ 371 (c)(1),
(2) Date: Oct. 25, 2017

(87) PCT Pub. No.: WO2017/009957
PCT Pub. Date: Jan. 19, 2017

(65) Prior Publication Data
US 2018/0151768 A1    May 31, 2018

(51) Int. Cl.
*H01L 31/05*    (2014.01)
*H01L 31/048*    (2014.01)
*H01L 31/18*    (2006.01)

(52) U.S. Cl.
CPC ........ *H01L 31/0508* (2013.01); *H01L 31/048* (2013.01); *H01L 31/1876* (2013.01); *Y02E 10/50* (2013.01)

(58) Field of Classification Search
CPC . H01L 31/05; H01L 31/0465; H01L 31/0508; H01L 31/1876; H01L 31/188; H02S 40/36; Y02E 10/50–58
(Continued)

(56) References Cited

FOREIGN PATENT DOCUMENTS

JP    11-177117 A    7/1999
JP    11-251613 A    9/1999
(Continued)

OTHER PUBLICATIONS

International Search Report (PCT/ISA/210) dated Aug. 11, 2015, by the Japanese Patent Office as the International Searching Authority for International Application No. PCT/JP2015/070189.
(Continued)

*Primary Examiner* — Eli S Mekhlin
*Assistant Examiner* — Dujuan A Horton
(74) *Attorney, Agent, or Firm* — Buchanan Ingersoll & Rooney PC

(57) ABSTRACT

An object of the present invention is to obtain an easy-to-work solar battery module having high joining strength as well as suppressing an increase in residual thermal stress without increasing the thickness of an interconnector. The solar battery module of the present invention includes a solar battery cell including a semiconductor substrate having pn junction, and a first electrode and a second electrode that are formed on a p-type region and an n-type region of the semiconductor substrate and an interconnector to connect the solar battery cell and an adjacent solar battery cell. The interconnector is a bundle of a plurality of round thin wires and includes abutment regions abutting on the first electrode and the second electrode of the adjacent solar battery cell.

11 Claims, 10 Drawing Sheets

(58) Field of Classification Search
USPC .................................................. 136/243–265
See application file for complete search history.

(56) References Cited

FOREIGN PATENT DOCUMENTS

| | | |
|---|---|---|
| JP | 2005-072115 A | 3/2005 |
| JP | 2005-191116 A | 7/2005 |
| JP | 2010-040591 A | 2/2010 |
| JP | 2012-060184 A | 3/2012 |
| JP | 2012-129359 A | 7/2012 |
| JP | 2013-211266 A | 10/2013 |
| JP | 2014-041940 A | 3/2014 |
| JP | 2014-183289 A | 9/2014 |

OTHER PUBLICATIONS

Written Opinion (PCT/ISA/237) dated Aug. 11, 2015, by the Japanese Patent Office as the International Searching Authority for International Application No. PCT/JP2015/070189.
Notification of Reasons for Refusal dated Jul. 10, 2018, issued in corresponding Japanese Patent Application No. 2017-528060, with an English machine translation thereof.

SOLAR BATTERY MODULE AND METHOD FOR MANUFACTURING SOLAR BATTERY MODULE

FIELD

The present invention relates to a solar battery module and a method for manufacturing the solar battery module.

BACKGROUND

A solar battery module has been configured by forming strings having solar battery cells electrically connected to one another through interconnectors, and connecting the strings between a glass substrate and a back surface cover member via sealing materials.

A base material used for the interconnector typically takes the form of a rectangular wire having a rectangular sectional shape. This rectangular wire is obtained by rolling a round wire into the rectangular sectional shape with a view to providing the interconnector with an area to be joined to the cells, and facilitating the manufacturing.

Unfortunately, the rectangular wire interconnector material is more expensive than the round wire as the working cost of the rectangular wire increases due to the rolling.

Even if the round wire is used, the round wire, which is circular in section, undesirably has its small area to be joined to an element electrode formed on a solar battery cell surface. For the round wire to have the same conductor sectional area as that of the rectangular wire, the diameter of the round wire should be large relative to the thickness of a rectangular wire. Increasing the thickness of the interconnector placed on and joined to the solar battery cell leads to an increase in residual thermal stress during the joining.

Patent Literature 1 discloses a technology for forming an element electrode on a solar battery cell surface into a circular hollow shape to provide the element electrode with an area to be joined to a round wire interconnector.

CITATION LIST

Patent Literature

Patent Literature 1: Japanese Patent Application Laid-Open No. 2012-129359

SUMMARY

Technical Problem

However, a problem with the conventional technology is that the residual thermal stress during the joining increases because the thickness of the round wire interconnector placed on and joined to the solar battery cell is large.

The present invention has been devised in view of the above, and an object of the present invention is to obtain an easy-to-work solar battery module that has high joining strength as well as suppressing an increase in residual thermal stress without increasing the thickness of an interconnector.

Solution to Problem

To solve the problem and achieve the object, a solar battery module of the present invention includes: a solar battery cell including a semiconductor substrate having pn junction, and a first electrode and a second electrode that are formed on a p-type region and an n-type region of the semiconductor substrate; and an interconnector connecting the solar battery cell and an adjacent solar battery cell. The interconnector is a bundle of metal wires and includes abutment regions abutting on the first electrode and a second electrode of the adjacent solar battery cell.

Advantageous Effects of Invention

The present invention provides an effect of obtaining the easy-to-work solar battery module that has the high joining strength as well as suppressing the increase in residual thermal stress without increasing the thickness of the interconnector.

BRIEF DESCRIPTION OF DRAWINGS

FIGS. 6(a) and 6(b) are diagrams showing a schematic configuration of a solar battery cell applied to the solar battery module in the first embodiment of the present invention, wherein FIG. 6(a) is a perspective view showing the schematic configuration of the solar battery cell as viewed from the side of the front surface and FIG. 6(b) is a perspective view of the schematic configuration of the solar battery cell as viewed from the side of the rear surface.

DESCRIPTION OF EMBODIMENTS

Figure 1:
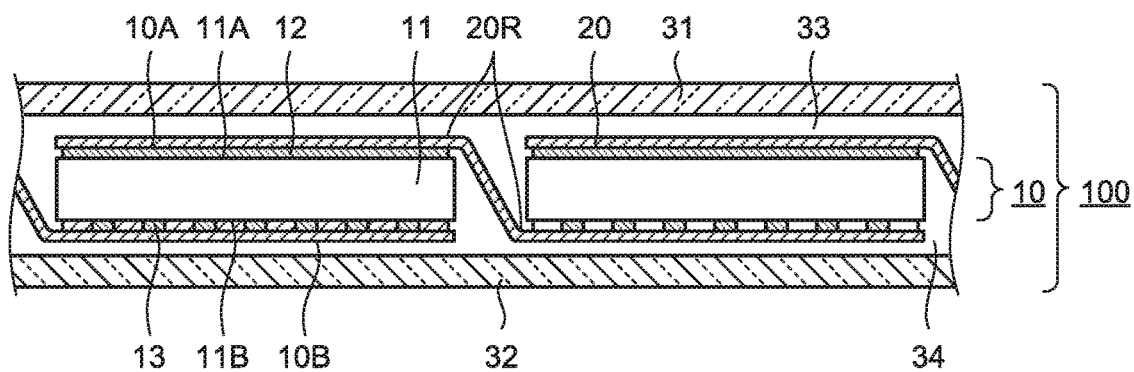
FIG. 1 is a sectional view of a solar battery module in a first embodiment of the present invention.

Solar battery modules and methods for manufacturing the solar battery modules according to embodiments of the present invention are explained in detail below with reference to the drawings. Note that the present invention is not limited by the embodiments. Note that, in the figures, the same or similar constituent portions are denoted by the same reference numerals and signs. To avoid the unnecessary redundant explanation and facilitate understanding of those skilled in the art, detailed explanation of already well-known matters and repetitious explanation of substantially the same components are omitted where appropriate. Contents of the following explanation and the accompanying drawings are not intended to limit the subject matters defined in the claims.

First Embodiment

Figure 2:
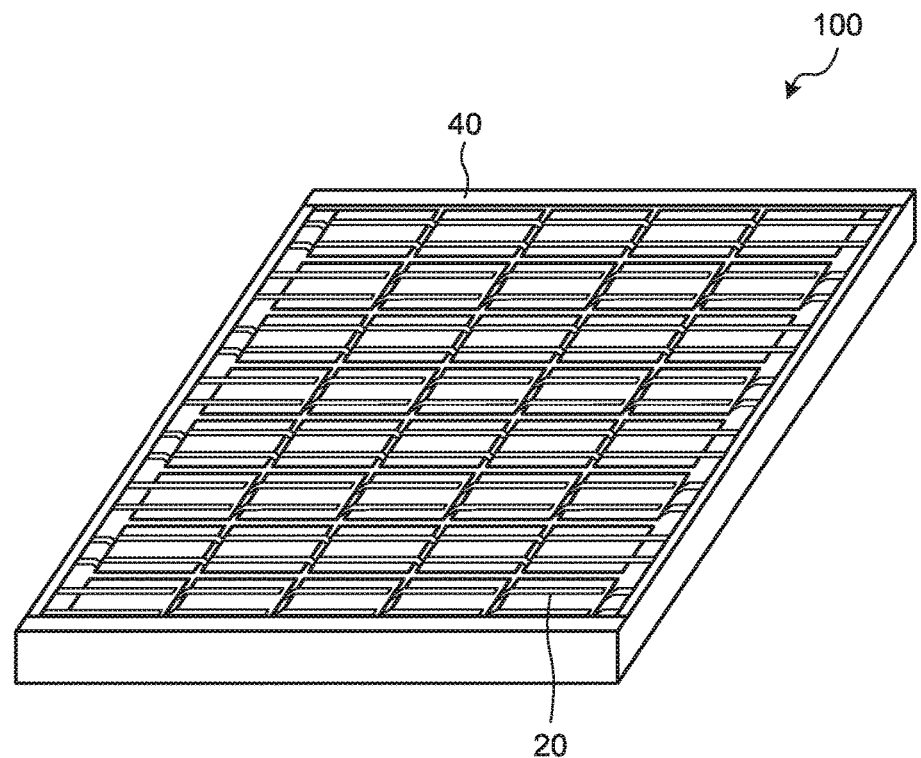
FIG. 2 is a perspective view of the solar battery module in the first embodiment of the present invention.
Figure 3:
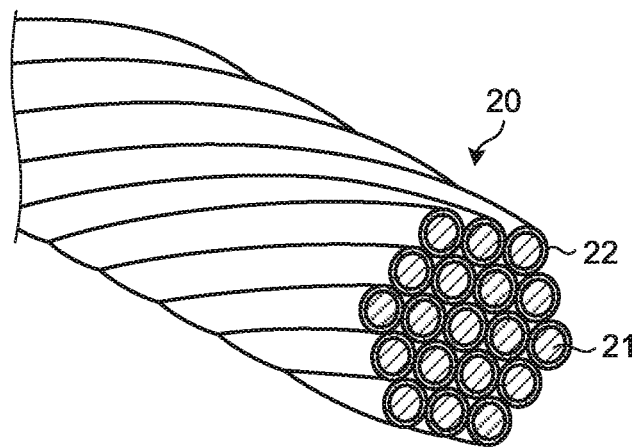
FIG. 3 is a perspective view showing an interconnector of the solar battery module in the first embodiment of the present invention.
Figure 4:
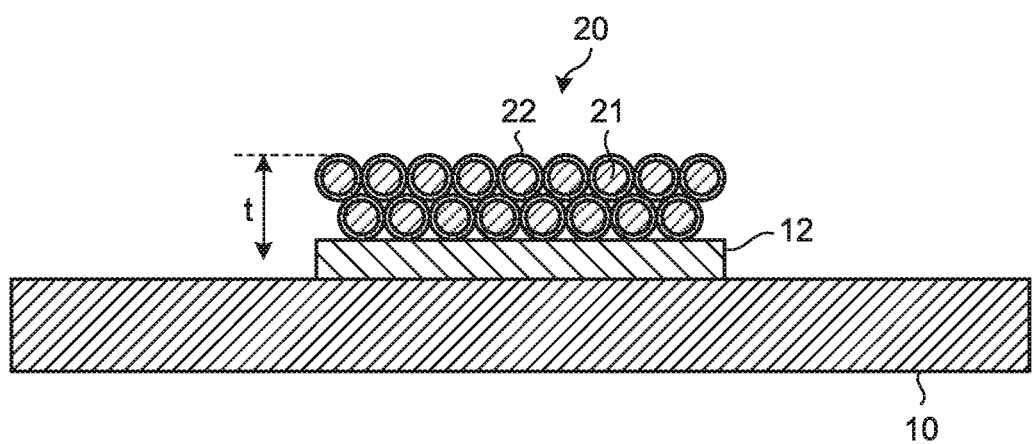
FIG. 4 is an enlarged sectional view of a main part of the interconnector of the solar battery module in the first embodiment of the present invention.
Figure 5:
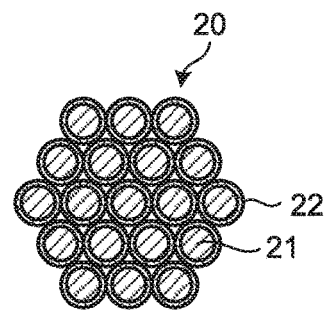
FIG. 5 is an enlarged sectional view of a main part of the interconnector of the solar battery module in the first embodiment of the present invention.
Figure 6A:
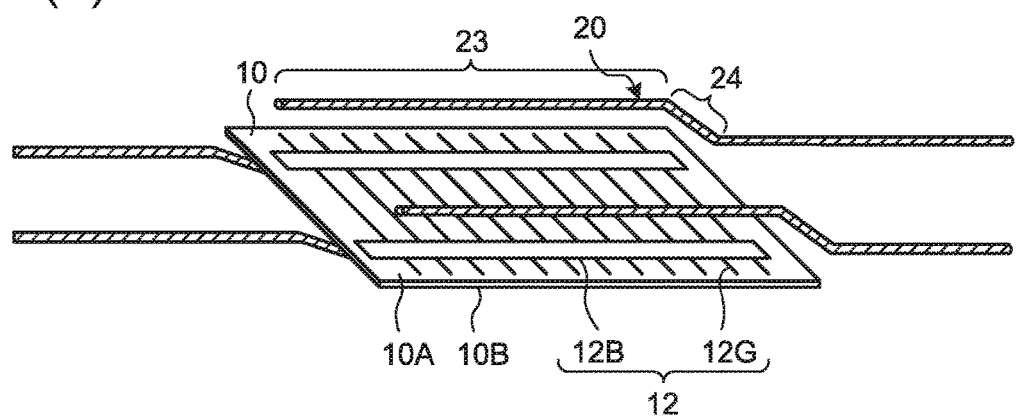
Figure 6B:
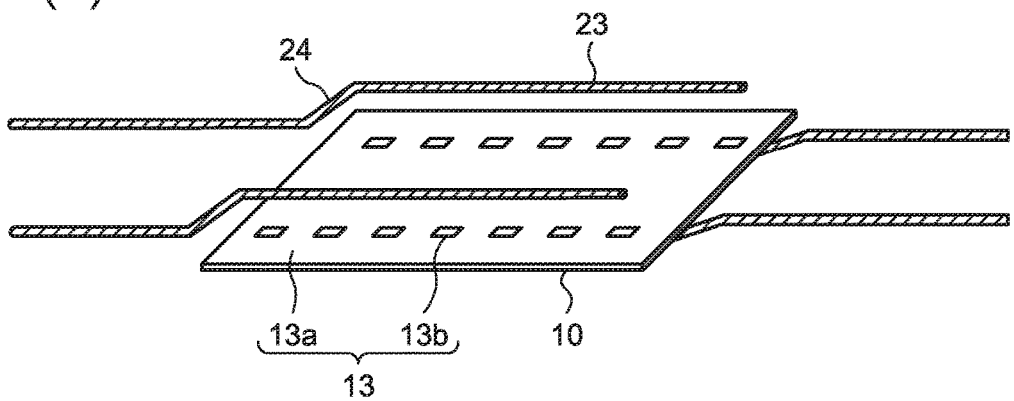
Figure 7:
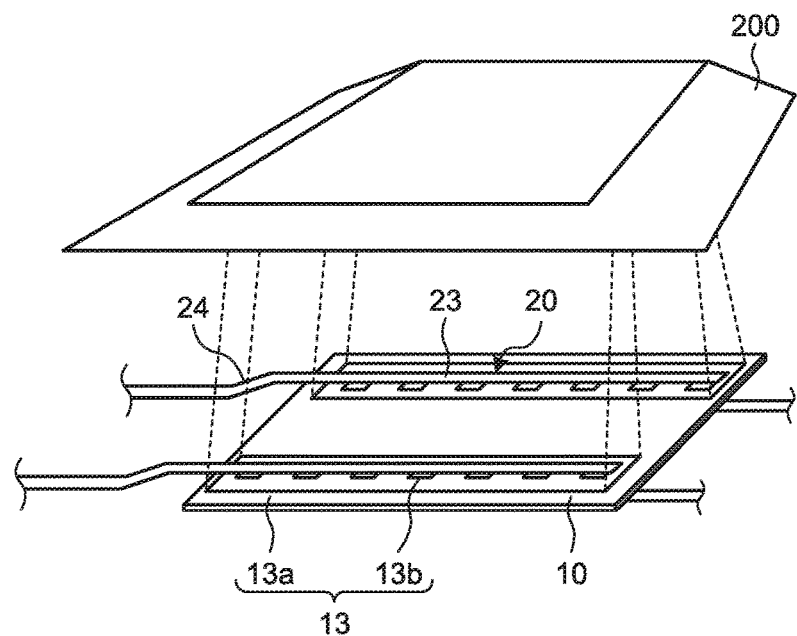
FIG. 7 is an explanatory diagram showing a step of connecting an interconnector in the first embodiment of the present invention.
Figure 8:
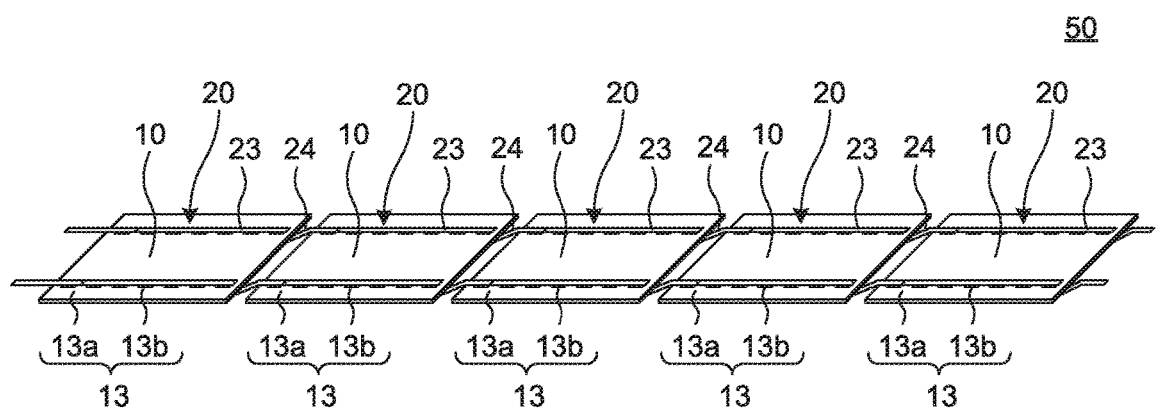
FIG. 8 is a perspective view showing a schematic configuration of a string in the first embodiment of the present invention.
Figure 9:
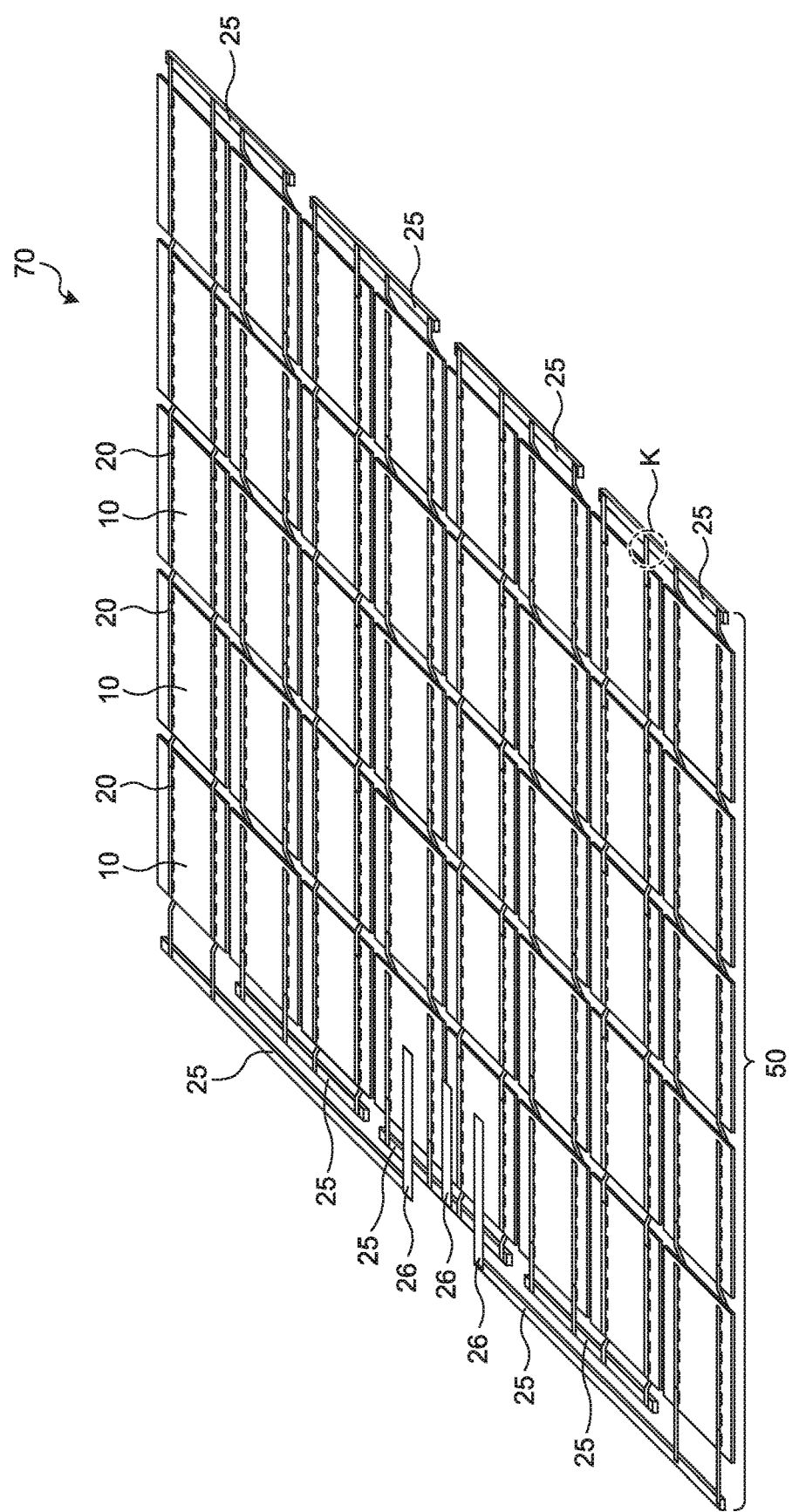
FIG. 9 is a perspective view showing a schematic configuration of a solar battery array in the first embodiment of the present invention.
Figure 10:
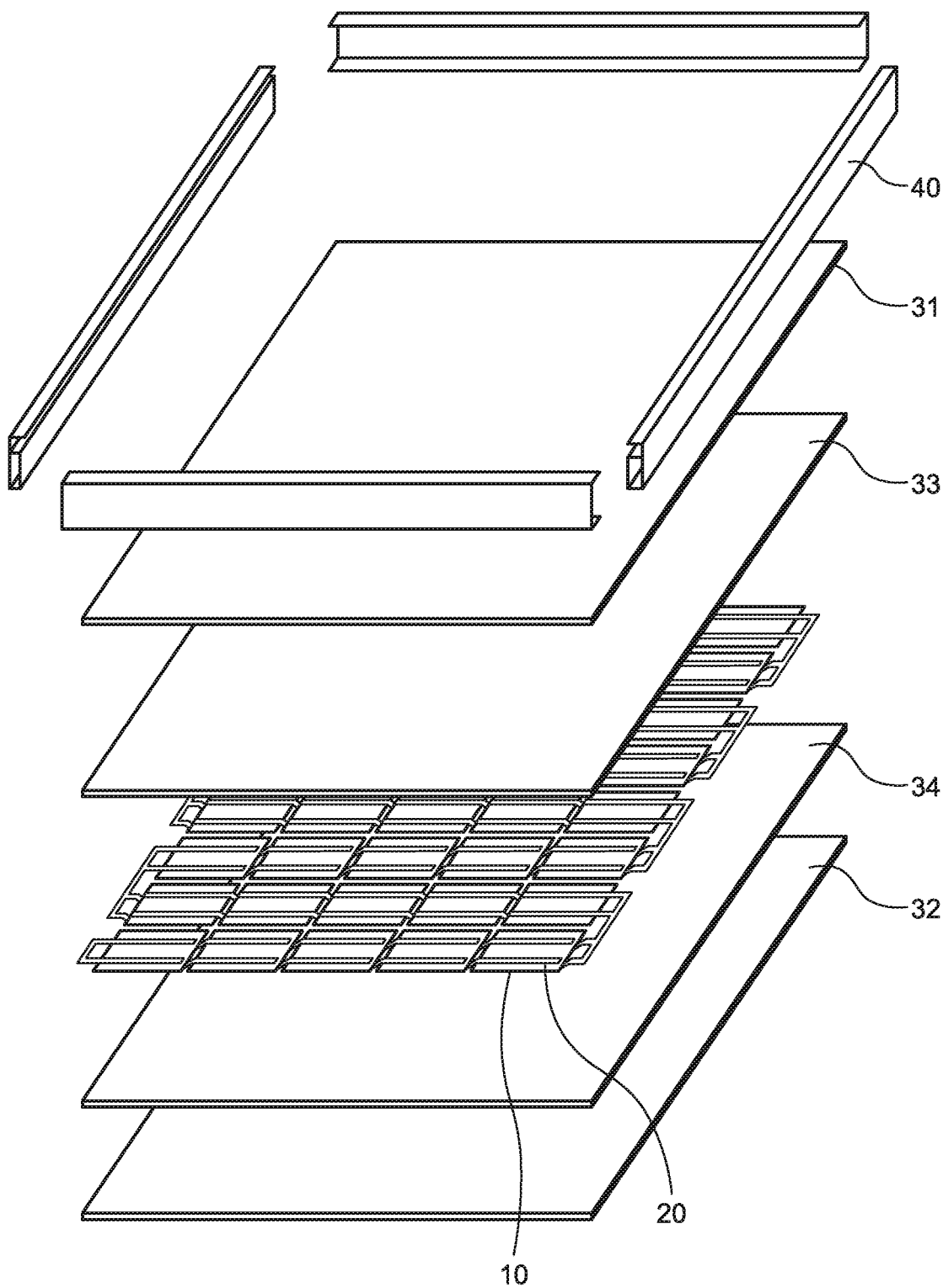
FIG. 10 is an exploded perspective view of a solar battery panel in the first embodiment of the present invention.
Figure 11:
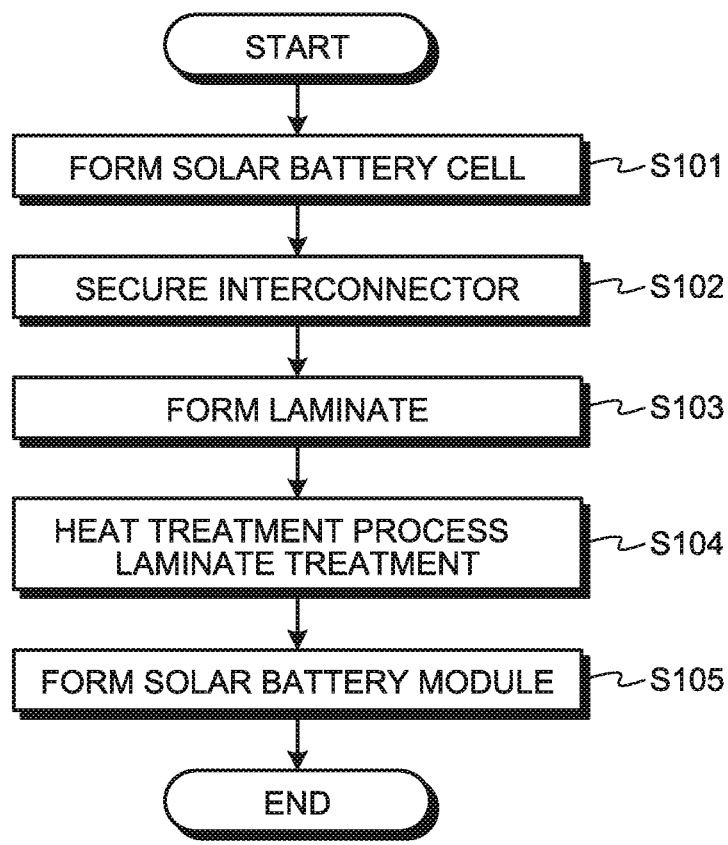
FIG. 11 is a flowchart showing a process of mounting the solar battery module in the first embodiment of the present invention.
Figure 12E:
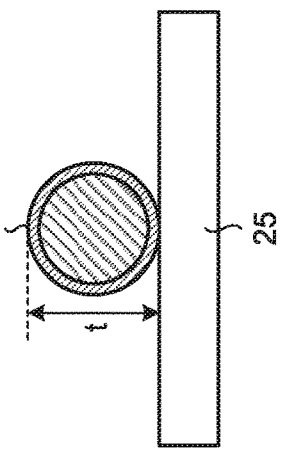
FIGS. 12(a) to 12(f) are schematic diagrams showing a state in which the interconnector in the first embodiment of the present invention is joined to a horizontal tab line and a state in which interconnectors in comparative examples are joined to horizontal tab lines in comparative examples.
Figure 12C:
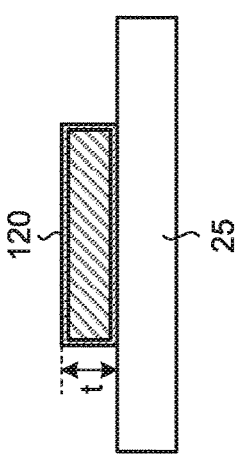
Figure 12A:
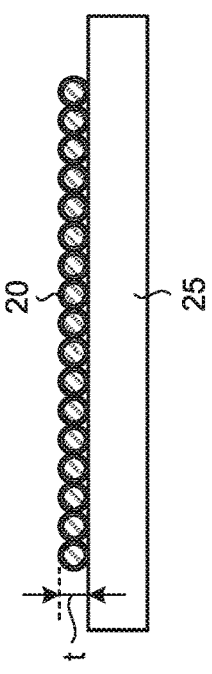
Figure 12F:
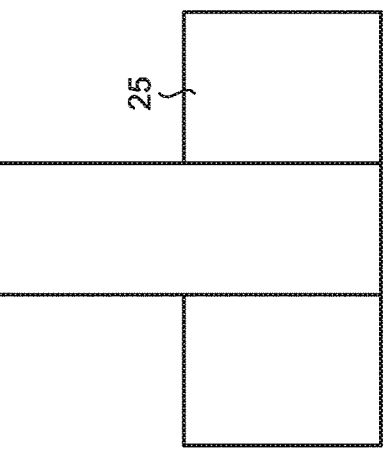
Figure 12D:
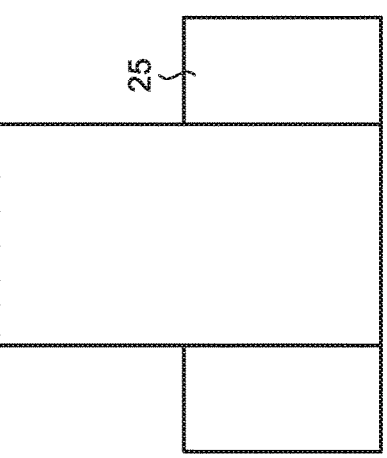
Figure 12B:
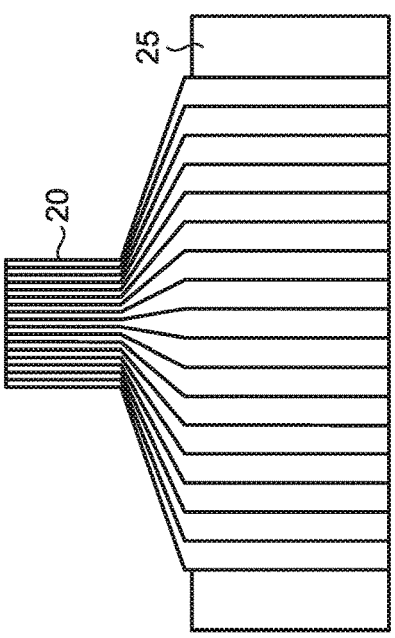

A solar battery module in a first embodiment of the present invention is explained in detail below with reference to the drawings. FIG. 1 and FIG. 2 are a sectional view and a perspective view of the solar battery module in the first embodiment. FIG. 3 is a perspective view showing an interconnector of the solar battery module. FIG. 4 is a sectional view of the interconnector in the first embodiment on a solar battery cell. FIG. 5 is a sectional view of an inter-element portion of the interconnector in the first embodiment. FIGS. 6(a) and 6(b) are perspective views showing schematic configurations of the solar battery cell applied to the solar battery module in the first embodiment as the solar battery cell is viewed from the side of the front surface and the side of the rear surface. FIG. 7 is an explanatory diagram showing a step of connecting an interconnector in the first embodiment. FIG. 8 is a perspective view showing a schematic configuration of a string in the first embodiment. FIG. 9 is a perspective view showing a schematic configuration of a solar battery array in the first embodiment. FIG. 10 is an exploded perspective view of a solar battery panel in the first embodiment. FIG. 11 is a flowchart showing a process of mounting the solar battery module in the first embodiment. The solar battery module in the first embodiment includes an interconnector 20 that connects solar battery cells. As illustrated in FIG. 3 showing the main part in an enlarged perspective, the interconnector 20 is defined by nineteen round thin wires 21 twisted together. Each wire 21 has a circular section. Note that the outer surfaces of the round thin wires 21 are coated with solder layers 22.

As shown in FIG. 1, a solar battery module 100 in the first embodiment includes solar battery cells 10 connected to each other through the interconnector 20. The solar batter cell 10 includes a semiconductor substrate 11 made of a p-type single crystal silicon substrate having a pn junction formed therein. The semiconductor substrate 11 has a light receiving surface 11A that is a first main surface, and a back surface 11B that is a second main surface. Formed on a side of the light receiving surface is a light receiving surface electrode 12. Formed on the back surface 11B is a back surface electrode 13. The side of the light receiving surface 11A of the p-type silicon substrate is subjected to texture etching to provide an uneven shape to increase an efficiency of light collection. An n-type diffusion layer (not shown) is formed on the side of the light receiving surface, and a silicon nitride film, which is a reflection preventing film, is formed on the n-type diffusion layer. Formed on the back surface 10B of the solar battery cell 10 is the back surface electrode 13 defined by a back-surface collector electrode 13a containing Al and back-surface joining electrodes 13b containing Ag. The back-surface collector electrode 13a is an electrode having a back-surface electric field layer for improving an open-circuit voltage and a short-circuit current and is provided to collect electric currents on the side of the back surface. The back-surface collector electrode 13a covers substantially the entire region of the back surface 10B of the solar battery cell 10.

The back-surface joining electrodes 13b are electrodes provided for electrically joining with the interconnector 20. The back-surface joining electrodes 13b are provided along a direction in which the interconnector 20 is joined. The back-surface collector electrode 13a and the back-surface joining electrodes 13b are formed by applying conductive paste including metal particles of Al and Ag, as discussed above, to the desired range and baking the conductive paste. As shown in FIG. 6(b), the back-surface joining electrodes 13b are provided in the form of skipping stones along the almost entire length of the solar battery cell 10 along the direction in which the interconnector 20 is joined. Note that the back-surface joining electrode 13b may be provided over the almost entire length of the solar battery cell 10 along the direction in which the interconnector 20 is joined.

Formed on the side of the light receiving surface 10A of the solar battery cell 10 are a plurality of light-receiving-surface grid electrodes 12G and light-receiving-surface bus electrodes 12B. The light-receiving-surface grid electrodes 12G are light-receiving-surface collector electrodes for collecting photocurrents generated by photo-electron conversion. The light-receiving-surface bus electrodes 12B are light-receiving-surface joining electrodes for joining with the interconnectors 20. The light-receiving-surface grid electrodes 12G are electrodes for collecting photocurrents. The light-receiving-surface grid electrodes 12G are formed of a large number of thin linear electrodes arranged in parallel to collect photocurrents in such a manner as not to hinder the sunlight from reaching the inside of the solar battery cell 10.

The light-receiving-surface bus electrodes 12B are provided in a direction orthogonal to the light-receiving-surface grid electrodes 12G. The light-receiving-surface bus electrodes 12B are electrodes provided to be electrically joined to the interconnectors 20. The light-receiving-surface bus electrodes 12B and the light-receiving-surface grid electrodes 12G are formed by applying conductive paste including metal particles to the desired range and baking the conductive paste.

As shown in FIG. 4 and FIG. 5, the interconnector 20 has a back surface region soldered to the back-surface joining electrodes 13b formed on the back surface 10B of the solar battery cell 10, a light-receiving-surface-side region soldered to the light-receiving-surface bus electrode 12B formed on the light receiving surface 10A of the adjacent solar battery cell 10. In this way, the adjacent solar battery cells 10 are connected to each other through the interconnector 20 to form a string 50.

The interconnector 20 includes a bent portion 20R to connect the light-receiving-surface bus electrode 12B of the solar battery cell 10 and the back-surface joining electrodes 13b of the adjacent solar battery cell 10.

A large number of metal round wires covered with solder layers is used as the interconnector 20. The interconnector 20 extends in a direction in which the solar battery cells 10 are connected to one another.

In the solar battery module 100 in the first embodiment, the interconnector 20 is configured by the twisted round thin wires 21 coated with the solder layers 22. The interconnectors 20 are used such that the soldering of the interconnector to the light receiving surface that is the first main surface 10A alternates with the soldering of the interconnector to the back surface that is the second main surface 10B, thereby providing the string 50 as shown in FIG. 8.

FIG. 9 is a perspective view showing a schematic configuration of a solar battery array 70 in the first embodiment of the present invention and shows a state viewed from the side of the back surface. As shown in FIG. 9, the solar battery strings 50 having the plural solar battery cells 10 connected to one other through the interconnectors 20 are further joined in series to one another through horizontal tab lines 25 and output tab lines 26 to thereby form the solar battery array 70.

FIG. 10 is an exploded perspective view of the solar battery module shown in FIG. 1 and FIG. 2. The solar battery module 100 includes a light-receiving-surface-side sealing material 33 and a light-receiving-surface protection material 31. The light-receiving-surface-side sealing material 33 seals the side of the light receiving surface 10A of the solar battery cell 10, and the light-receiving-surface-side sealing material 33 and the light-receiving-surface protection material 31 cover the side of the light receiving surface 10A. The solar battery module 100 also includes a back-surface-side sealing material 34 and a back-surface protection material 32 that cover the side of the back surface 10B. The solar battery module 100 further includes a reinforcement frame 40 serving as an outer frame surrounding the periphery. In the first embodiment, the light-receiving-surface-side sealing material 33, the light-receiving-surface protection material 31, the back-surface-side sealing material 34, and the back-surface protection material 32 are collectively referred to as sealing resin.

The interconnector 20 connected to the light-receiving-surface bus electrodes 12B formed on the light receiving surface 10A is connected to the back-surface joining electrodes 13b formed on the back surface 10B of the adjacent solar battery cell 10, such that the interconnectors connect the plurality of solar battery cells 10 to one another in series.

As shown in the sectional view of the solar battery module 100 in FIG. 1, the solar battery cell 10 comprises the semiconductor substrate 11 made of the p-type single crystal silicon substrate having a thickness of between 0.1 millimeters and 0.2 millimeters, inclusive. The semiconductor substrate 11, which configures the solar battery cell 10, has the pn junction formed therein. The light-receiving-surface bus electrodes 12B and the back-surface joining electrodes 13b are provided on the light receiving surface 11A and the back surface 11B of the semiconductor substrate 11, respectively. Further, the reflection prevention film is provided on the light receiving surface 11A. For the single crystal silicon solar battery, the solar battery cell 10 is sized to have its one side of length of approximately between 150 millimeters and 156 millimeters, inclusive. Note that the semiconductor substrate is not limited to the p-type single crystal silicon substrate. An n-type single crystal silicon substrate, a polycrystal silicon substrate, and the like are also applicable. Note that, in FIG. 1, both of the pn junction and the reflection prevention film are not shown.

The interconnector 20 functioning as a wiring component is formed of the nineteen twisted round thin copper-made wires 21 having the solder layers 22 plated on the surface thereof, each wire 21 having a diameter of approximately 0.05 millimeters. As shown in FIG. 6, the interconnector 20 is configured by an abutment region 23 defining a connecting portion connected to the solar battery cell 10 and an inter-element portion 24. The abutment region 23 on the light-receiving-surface bus electrode 12B of the solar battery cell 10 is in a rectangular shape having an electrode width slightly larger than the width of the light-receiving-surface bus electrode 12B and having thickness of approximately t=0.1 mm to 0.4 mm, as shown in the sectional view of FIG. 4. The interconnector 20 is soldered to the solar battery cells 10 to thereby electrically connect the light-receiving-surface bus electrodes 12B of the solar battery cell 10 to the back-surface joining electrodes 13b of the adjacent solar battery cell 10. The inter-element portion 24 is the twisted round wires maintaining their round outer contours, as shown in FIG. 5.

Material having translucency, heat resistance, electric insulation, and flexibility is used for the back-surface-side sealing material 34 and the light-receiving-surface-side sealing material 33 that are disposed on the side of the rear back surface 10B and the side of the light receiving surface 10A. Preferably, thermoplastic synthetic resin material containing thermoplastic resin such as ethylene vinyl acetate (EVA) or polyvinyl butyral (PVB) as a main component is used for the materials 33, 34. Note that a glass plate is also applicable as a translucent substrate configuring the light-receiving-surface protection material 31. This plate used is in the form of a sheet having thickness of between 0.4 millimeters and 1.0 millimeter, inclusive.

The back-surface-side sealing material 34 and the light-receiving-surface-side sealing material 33 are thermally cross-linked to be fused with the light-receiving-surface protection material 31, the solar battery string 50, and the back-surface protection material 32 in a lamination step under decompression of an air pressure of between 0.5 atm and 1.0 atm, inclusive, such that the sealing materials 34, 33, the protection materials 31, 32, and the solar battery strings 50 are integrated with one another.

Material that is superior in translucency, humidity resistance, weather resistance, hydrolysis resistance, and insulation is used for the light-receiving-surface protection material 31. A rigid translucent substrate such as a glass substrate, or a resin material such as a fluorocarbon resin sheet or a polyethylene terephthalate (PET) sheet is used for the light-receiving-surface protection material 31.

Material that is superior in humidity resistance, weather resistance, hydrolysis resistance, and insulation is used for the back-surface protection material 32. A resin material such as a fluorocarbon resin sheet or a polyethylene terephthalate (PET) sheet on which alumina or silica is deposited is used for the back-surface protection material 32.

The solar battery module 100 as used herein is defined as including the solar battery string 50 having the connected solar battery cells 10, the light-receiving-surface protection material 31, the back-surface protection material 32, the light-receiving-surface-side sealing material 33, and the back-surface-side sealing material 34. However, it is noted that the solar battery module 100 is not limited to the module as defined above. The solar battery cells 10 having the light receiving surface electrodes 12 and the back surface electrodes 13 joined to the interconnectors 20 that are the external connection terminals is sealed with sealing materials, and such sealed solar battery cells 10 may be referred to as the solar battery module 100.

The solar battery cell 10 in the first embodiment is in a generally flat-sheet shape. However, the solar battery cell 10 is not limited to the flat-sheet-shaped solar battery cell. For example, the solar battery cell 10 may have a flexible sheet shape or a cubic shape. The solar battery cell 10 may have any shape provided that the solar battery cell 10 has the collector electrodes connected to the interconnectors. The collector electrode may be used in a solar battery cell, which is a so-called back-surface extraction type solar battery cell having the collector electrode formed only on the back surface thereof.

Although the back-surface joining electrodes 13b in the first embodiment are formed in two rows on the back surface 10B of the solar battery cell 10, the number of rows of the back-surface joining electrodes 13b is not limited to two, and the solar battery cell 10 may have back-surface joining electrodes formed in one or more rows on the back surface thereof.

A method for manufacturing the solar battery module in the first embodiment is explained. FIG. 11 is a flowchart. First, at step S101, a solar battery cell is formed. The solar battery cell 10 includes a p-type single crystal silicon substrate that is a start material subjected to texture etching to provide an uneven shape formed on the light receiving surface 11A to improve efficiency of light collection. The side of the light receiving surface has a n-type diffusion layer (not shown) formed thereon through the diffusion to thereby provide the pn junction. The silicon nitride film functioning as a reflection prevention film is formed on the surface of the diffusion layer. Formed on the light receiving surface 10A of the solar battery cell 10 is the light receiving surface electrode 12 defined by the light-receiving-surface grid electrodes 12G and the light-receiving-surface bus electrodes 12B for collecting electrons generated by photo-electron conversion, as shown in FIG. 6(a).

As shown in FIG. 6(b), the back-surface collector electrode 13a formed by the Al electrode and the back-surface joining electrodes 13b formed by the Ag electrodes are formed on the back surface 10B of the solar battery cell 10. The back-surface collector electrode 13a is the electrode, which is provided for forming the back-surface electric field layer for improving the open-circuit voltage and the short-circuit current, is formed to cover the substantially entire region of the back surface of the solar battery cell 10.

The back-surface joining electrodes 13b formed by the Ag electrodes are the electrodes provided to contact the adjacent cell or an external element. The back-surface collector electrode 13a and the back-surface joining electrodes 13b are formed by applying conductive paste including metal particles to the desired range and baking the conductive paste. In the first embodiment, after the back-surface joining electrodes 13b are formed by screen printing, the Al electrode functioning as the back-surface collector electrode 13a is formed.

As shown at step S102, the interconnectors 20 are disposed on the solar battery cell 10 and then heated to be soldered to the solar battery cell 10, such that the interconnectors 20 are secured to the solar battery cell 10, as shown in FIG. 6(a) illustrating the side of the light receiving surface and in FIG. 6(b) illustrating the side of the back surface.

FIG. 7 is a diagram showing an interconnector joining step of electrically joining the interconnectors 20 to the light receiving surface electrode 12 and the back surface electrode 13 in the first embodiment of the present invention. As shown in FIG. 7, the abutment regions 23 on the sides of the back surfaces of the interconnectors 20 lie on the back-surface joining electrode 13b of the solar battery cell 10 while the abutment regions 23 of the interconnectors 20 lie on the light-receiving-surface bus electrodes 12B. In this state, electric joining between the interconnectors 20 and the back-surface joining electrodes 13b and electric joining between the interconnectors 20 and the light-receiving-surface bus electrodes 12B are simultaneously achieved by heating by a heat tool 200.

Note that, the interconnector joining step may be performed through two separate steps that are the step of joining the side of the rear back and the step of joining the side of the light receiving surface.

FIG. 8 is a perspective view showing a schematic configuration of the solar battery string 50 having the solar battery cells 10 temporarily attached to one another by the method according to the first embodiment. As shown in FIG. 8, the plurality of solar battery cells 10 are provided side by side and connected in series by the interconnectors 20 to form the solar battery string 50. That is, the interconnector 20 has its one end side defining the abutment region 23 soldered to the back-surface joining electrodes 13b formed on the back surface 10B of the solar battery cell 10. The abutment region 23 defined by the opposite end side of the interconnector 20 is soldered to the light-receiving-surface bus electrode 12B formed on the light receiving surface 10A of the adjacent solar battery cell 10. In this way, the adjacent solar battery cells 10 are connected to each other through the interconnectors 20 in this way to form the solar battery string 50.

The twisted wires are used as the interconnector 20. The twisted wires are formed by drawing copper wires into predetermined diameters, immersing the drawn wires in a solder tank to provide the solder-coated round thin wires 21, and twisting the round thin wires 21 together. The interconnector 20 extends in the direction in which the solar battery cells 10 are connected to one another, and as viewed in plan, assumes a substantially rectangular shape.

Using, as the solder layer in the first embodiment, solder having a melting point lower than a hardening temperature of a sealing material such as In-based lead-free solder of low-melting point or Bi-based lead-free solder allows a single heat treatment after formation of the laminate to secure the interconnectors to the plural solar battery cells at one time. This is because the solder melts at the hardening temperature of the sealing material, such that the soldering can be done simultaneously with the heating during the lamination step. For example, Sn-58Bi, which is Bi-based solder, has a melting point of 138° C., Sn-58Bi-1Ag has a melting point of 137° C., and Sn-52In, which is In-based solder, has a melting point of 117° C. Such solder enables the soldering at the low temperatures as compared with a melting point 227° C. of Sn—Ag—Cu-based solder. Note that content rates of Bi and In described herein are examples and do not specify this embodiment. A melting point of the low-melting-point lead-free solder only has to be equal to or lower than a melting temperature of resin in the lamination step.

As explained below in a third embodiment, it is desirable to temporarily secure the interconnector 20 with temporary tacking tapes or the like, because the interconnector may be displaced from the back-surface joining electrodes 13b when the interconnectors 20 are secured to the solar battery cells by a collective heat treatment as described in a third embodiment. Note that, when the interconnector 20 is unlikely to be displaced, the interconnector 20 is merely disposed as the interconnector need not be temporarily secured.

FIG. 9 is a perspective view showing a schematic configuration of the solar battery array 70 having the plurality of the solar battery strings 50 obtained as discussed above, the solar battery strings being connected to one another through the horizontal tab lines 25. The solar battery array 70 is formed by arranging the plurality of solar battery strings 50 in parallel, connecting the parallel solar battery strings 50 in series using the bus bars functioning as the horizontal tab lines 25, and setting the bus bars functioning as output tab lines 26 for taking electric power.

At step S103, as shown in FIG. 10, the laminate is formed by disposing the light-receiving-surface-side sealing material 33 and the light-receiving-surface protection material 31 on the side of the light receiving surface of the thus obtained solar battery array 70 and disposing the back-surface-side sealing material 34 and the back-surface protection material 32 on the side of the back surface of the array 70.

The thus formed laminate is then mounted on a lamination device, and subjected to heat treatment for approximately 30 minutes at a temperature of between 140° C. and 160° C., inclusive at step S104 to thereby form a solar battery module at step S105.

The interconnector 20 in the first embodiment is configured by a bundle of twisted wires, as shown in FIG. 3. More specifically, the interconnector 20 is the twisted bundle of the plural solder-plated round thin wires 21, as shown in FIG. 3. Each of the round thin wires 21 is coated with the solder layers 22 and is in a spiral shape. The interconnector 20 itself has elasticity, such that, when the side of the back surface 10B and the side of the light receiving surface 10A of the solar battery cell 10 are connected through the interconnector, the interconnector is bent due to a difference in level therebetween resulting from the thickness of the substrate of the solar battery cell 10. Stress due to the bent is lessened by the twisted wires. Therefore, the twisted wires serve as a cushioning member to lessen stress due to excessive temperature stress near the interconnector 20 during the joining. Minimization of temperature stress applied in joining the interconnector to the collector electrode of the solar battery cell prevents a crack that would otherwise occur in the solar battery cell.

Since the material of the interconnector 20 is the round thin wire 21 that easily has a desired diameter achieved through the drawing process, the working cost is less, waste of the material is less as compared with when a rectangular wire is formed from a round wire, and a reduction in cost can be achieved. The abutment regions abutting on the light receiving surface electrode and the back surface electrode have their larger contact areas and hence significantly improves the joining strength.

In general, a solar battery module is configured by components having different coefficients of thermal expansion such as the solar battery cell 10, the light-receiving-surface-side sealing material 33, and the light-receiving-surface protection material 31, the back-surface-side sealing material 34 and the back-surface protection material 32 on the back surface side, and the interconnector 20. When the temperature of a solar battery module changes under the influence of ambient temperature, the influence of heat generation during the operation, or the like, therefore, stress occurs in the respective components due to a difference in a volume change caused by the temperature change. In particular, it is known that, of the components of the solar battery module 10, the bent portion 20R of the interconnector 20 shown in FIG. 1 is intensively subjected to distortion and thus the bent portion 20R is broken first by stress that repeatedly occurs during the use of the solar battery module.

On the other hand, the solar battery module 100 in the first embodiment uses the bundle of twisted wires as the interconnector 20. The round thin wires 21 coated with the solder layers 22 that configure the interconnector 20 are in the spiral shapes have the elasticity sufficient to expand and contract. In the presence of a difference in the coefficient of thermal expansion among the components of the solar battery module 100, therefore, the expansion and contraction of the interconnector 20 lessens a difference in a volume change caused by the temperature change, thereby reducing stress that occurs in the bent portion 20R due to the temperature change. The solar battery module, which decreases the stress, is superior in reliability.

The interconnector 20 defined by the bundle of twisted wires, which is usually the bundle of the round thin wires 21 as shown in FIG. 3, has a generally circular sectional shape. However, when the light receiving surface electrode 12 and the interconnector 20 of the solar battery cell 10 are heated and joined by the heat tool 200, the interconnector 20 is clamped, such that the interconnector 20 can have a similar area joined to the cell light receiving surface electrode to a joining area of the rectangular wire and maintain a similar overall height of the interconnector 20 to the overall height of the rectangular wire, as compared with one round wire interconnector having the same sectional area. That is, the interconnector can maintain similar residual thermal stress to residual thermal stress in the rectangular wire.

FIG. 12 is a diagrammatical sectional view of the abutment regions of the interconnector 20 and the one round wire interconnector as the interconnector 20 and the one round wire interconnector are joined to the horizontal tab lines in different states. FIGS. 12(a) and 12(b) are a sectional view and a top plan view showing a connection of the interconnector 20 to the horizontal tab line 25 as the interconnector 20 being defined by the twisted wires in the first embodiment. FIGS. 12(c) and 12(d) are a sectional view and a top plan view showing a connection of an interconnector 120 to the horizontal tab line 25 as the interconnector 120 being defined by a rectangular conductor. FIGS. 12(e) and 12(f) are a sectional view and a top plan view showing a connection of an interconnector 220 to the horizontal tab line 25 as the interconnector 220 being defined by a round wire.

In the first embodiment, the interconnector 20 is clamped when the interconnector 20 is joined to the horizontal tab line 25. As a result, the bundle-shaped interconnector increases its joining area and decreases its height, as compared with the interconnector 220 defined by one round wire having the same sectional area, that is, an insulation distance between the interconnector 20 and another member is long. The same effect is achieved as compared with the interconnector 120 defined by the rectangular conductor.

As explained above, in addition to using the round wires to reduce the working cost of the interconnector, the solar battery module in the first embodiment can reduce stress that occurs in the stepped portion between the elements as a result of temperature change due to the difference in the coefficients of thermal expansion of the components of the solar battery module. The interconnector can also have the area joined to the cell and keep its similar thickness to the thickness of the rectangular wire. The solar battery module can also reduce the residual thermal stress to be smaller than the residual thermal stress of the rectangular wire.

Note that, in the first embodiment, the interconnector 20 has its quadrangular, external shape only at the abutment region abutting on the solar battery cell 10, as shown in FIG. 4, and is formed as the assembly of the round thin wires at the other regions, as shown in FIG. 5. However, the interconnector 20 may have the quadrangular sectional shape along the entire region thereof. The interconnector 20, which has the quadrangular sectional shape along the entire region thereof, can provide not only the effects discussed in the first embodiment, but also the effect that a typically used device for a rectangular conductor can be used as it is.

The interconnector 20 may be entirely formed as a bundle of round thin wires as shown in FIG. 5. The interconnector 20, which is entirely formed as the bundle of the round thin wires, can provide not only the effects discussed in the first embodiment, but also such a large elasticity as to achieve a further cushioning effect in the abutment region between the interconnector 20 and the solar battery cell 10.

At the abutment region of the interconnector 20 abutting on the horizontal tab line 25, additionally, the round thin wires are horizontally arranged to provide a quadrangular shape wider than the sectional width of any other region. Therefore, the interconnector is firmly connected to the horizontal tab line 25, thereby providing a higher reliability.

The interconnector, which extends from the first electrode of the solar battery cell to the second electrode of the adjacent solar battery cell, is configured by the twisted wires, thereby preventing stress from remaining in the bent portion and thus achieving the highly reliable connection.

The external shapes of the interconnector in the abutment regions abutting on the first electrode and the second electrode are set to be the same in width as the first electrode and the second electrode. Consequently, it is possible to firmly connect the interconnector to the first and second electrodes without the need to reduce the light-receiving area. In particular, the external shapes of the abutment regions of the interconnector abutting on the first electrode and the second electrode are desirably the quadrangular sectional shapes. The external shape of the inter-element portion of the interconnector located between the electrode and the second electrode of the adjacent solar battery cell is the circular sectional shape and thus has a larger elasticity that provides the higher cushioning effect, such that a reduction in residual stress in the bent portion of the interconnector can be achieved.

The interconnector is larger in width on the outside of the solar battery cell than on the solar battery cell, such that the interconnector on the outside of the solar battery cell has a large area contacting the sealing resin and thus can increase the strength of joining with the sealing resin.

The round thin wires of the interconnector on the outside of the solar battery cell are arranged in one row and connected to the horizontal tab line, thereby increasing the connection strength.

Second Embodiment

Figure 13:
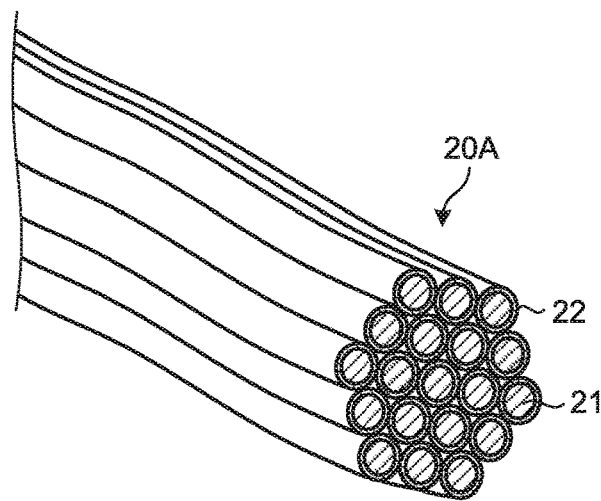
FIG. 13 is a perspective view showing an interconnector of a solar battery module in a second embodiment of the present invention.

A solar battery module in a second embodiment is explained in detail with reference to the drawings. FIG. 13 is a perspective view showing an interconnector of the solar battery module in the second embodiment. The interconnector 20 in the first embodiment is configured by the round thin wires 21 twisted together while an interconnector 20A in the second embodiment is configured by a bundle of the round thin wires 21 coated with the solder layers 22 rather than by the twisted wires. That is, the interconnector 20A in the second embodiment is formed of a parallel plurality of the round thin wires that do not form a twist. The other components are the same as the components of the interconnector in the first embodiment. Except for the interconnector, the solar battery module is the same as the solar battery module in the first embodiment. Thus, explanation of the other elements than the interconnector is omitted. The same components are denoted by the same reference numerals and signs.

Since the interconnector of the solar battery module in the second embodiment is the nineteen round thin wires bundled without configuring the twisted wires, as explained above, the shape of the interconnector on the electrode is changed to conform to the electrode shape of the lower layer when the interconnector is joined thereto. As in the solar battery module in the first embodiment, in addition to using the round wires to reduce the working cost of the interconnector, the solar battery module in the second embodiment can reduce stress that occurs in the inter-element portion 24 as a result of a temperature change due to a difference in coefficients of thermal expansion of the components of the solar battery module. The interconnector of the solar battery module in the second embodiment can have the area joined to the cell and keep the similar thickness to thickness of a rectangular wire, that is, maintain the similar residual thermal stress to residual thermal stress of the rectangular wire.

Third Embodiment

Figure 14:
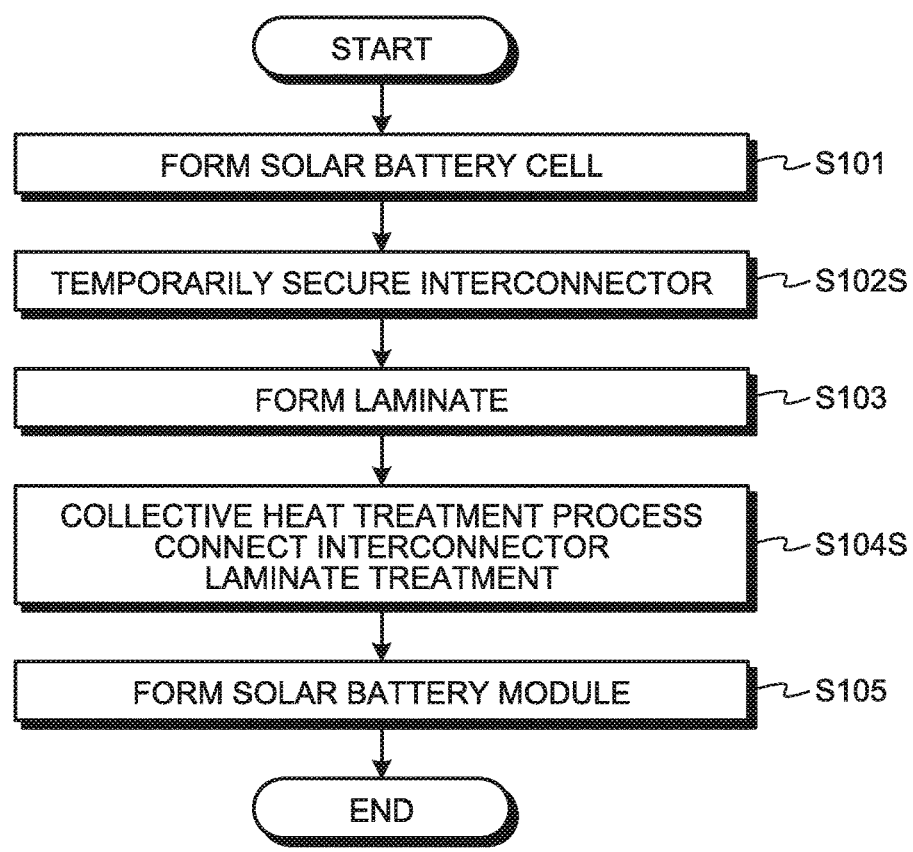
FIG. 14 is a flowchart showing a process of mounting a solar battery module in a third embodiment of the present invention.

A solar battery module in a third embodiment is explained in detail with reference to the drawings. In the third embodiment, a process of manufacturing the solar battery module includes, as shown in a flowchart of FIG. 14, steps of temporarily disposing on the solar battery cells interconnectors 20B with low-melting-point solder having a melting point lower than a hardening temperature of the sealing material, placing the sealing materials on the solar battery cells with the interconnectors 20B temporarily disposed thereon, and soldering the interconnectors to the solar battery cells and thermally hardening the sealing material in the collective heat treatment process.

Figure 15:
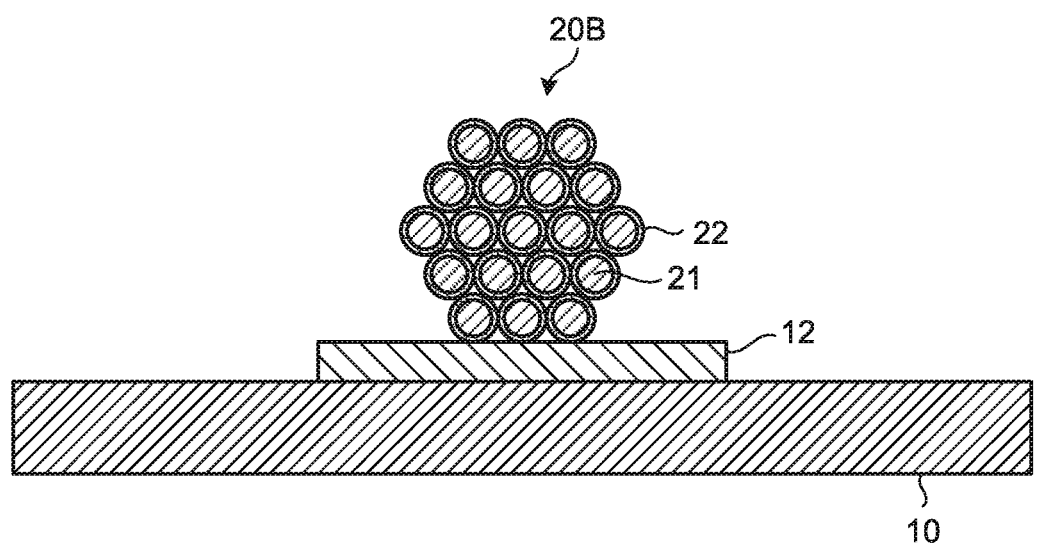
FIG. 15 is an enlarged sectional view of a main part of an interconnector of the solar battery module in the third embodiment of the present invention.

The interconnector 20B on the light receiving surface electrode 12 on the solar battery cell 10 is shown in FIG. 15. As shown in FIG. 15, the interconnector 20B differs from the interconnector in the first embodiment in that the interconnector 20B keeps the shapes of the twisted wires on the light receiving surface electrode 12. Although not shown, the overall structure of the solar battery module 100 in the third embodiment is the same as that shown in FIG. 1. The solar battery module 100 in the third embodiment includes the interconnector 20B configured by the twisted round thin wires 21 coated with the solder layers 22, as in the solar battery module shown in FIG. 1. The solar battery module 100 in the third embodiment uses low-melting-point lead-free solder in connecting the solar battery cells 10 to one another through the interconnectors. The soldering of the interconnectors to the solar battery cells 10 is done at one time in the laminate treatment step that uses the light-receiving-surface protection material 31 and the back-surface protection material 32. The solar battery string 50 has the interconnector 20B alternately connected through the low-melting-point lead-free solder to the light receiving surface 10A that is the first main surface and to the back surface 10B that is the second main surface. The light-receiving-surface protection material 31 is disposed on the side of the light receiving surface 10A of the solar battery string 50 while the back-surface protection material 32 is disposed on the side of the back surface 10B. The light-receiving-surface-side sealing material 33 is disposed between the solar battery string 50 and the light-receiving-surface protection material 31 while the back-surface-side sealing material 34 is disposed between the solar battery string 50 and the back-surface protection material 32.

Solder having a melting point lower than a hardening temperature of the sealing material such as In-based lead-free solder of low-melting point or Bi-based lead-free solder is used as the solder layer in the third embodiment such that the interconnectors are secured to the solar battery cells at one time through a single heat treatment after formation of the laminate. This is because the solder melts at the hardening temperature of the sealing material, such that the soldering can be done simultaneously with the heating in the lamination step. For example, Sn-58Bi, which is Bi-based solder, has a melting point of 138° C., Sn-58Bi-1Ag has a melting point of 137° C., and Sn-52In, which is In-based solder, has a melting point of 117° C. Such solder enables the soldering at the low temperatures, as compared with a melting point 227° C. of Sn—Ag—Cu-based solder. Note that content rates of Bi and In described herein are examples and do not specify this embodiment. A melting point of the low-melting-point lead-free solder only has to be equal to or lower than a melting temperature of resin in the lamination step.

In this embodiment, a temporary securing step S102S is performed using a temporary tacking tape instead of step S102 of securing the interconnector 20.

As shown in FIG. 9, the solar battery array 70 has the plurality of solar battery strings 50 obtained as discussed above, the solar battery strings being connected to one another through the horizontal tab lines 25. The solar battery array 70 is formed by arranging the plural solar battery strings 50 in parallel, connecting the parallel solar battery strings 50 in series to one another using bus bars functioning as the horizontal tab lines 25, and setting bus bars functioning as the output tab lines 26 for taking electric power.

As shown in FIG. 10, at step S103, the laminate is formed by disposing the light-receiving-surface-side sealing material 33 and the light-receiving-surface protection material 31 on the side of the light receiving surface of the solar battery array 70 obtained as discussed above and disposing the back-surface-side sealing material 34 and the back-surface protection material 32 on the side of the back surface.

The thus formed laminate is then mounted on the lamination device, and subjected to the collective heat treatment for approximately 30 minutes at a temperature of between 140° C. and 160° C., inclusive, to thereby simultaneously perform the connection of the interconnector 20 and the laminate treatment at step S104S, thereby forming the solar battery module at step S105.

In general, the respective steps are performed for approximately thirty minutes at the lamination temperature $T_0$ of between 140° C. and 160° C., inclusive, at a curing temperature $T_1$ of between 130° C. and 150° C., inclusive, and an ordinary temperature of $T_2$ after the curing. Solder melts at temperature equal to or higher than a solder melting point of t° C. and coagulates at temperature equal to or lower than the solder melting point CC to thereby enable the electric joining.

Consequently, it is possible not only to shorten the time for manufacturing but also to reduce the manufacturing cost. It is also possible to manufacture the solar battery module with only thermal stress applied once, thereby reducing the thermal stress applied to the solar battery cell and thus improving crack countermeasures and long-term reliability of the solar battery cell. Note that lamination conditions or processes related to the foregoing are examples and do not specify the present invention.

According to the method for manufacturing the solar battery module in the third embodiment, further, the lamination and the soldering are achieved while the satisfactory support is performed because the solar battery module is heated together with the light-receiving-surface protection material and the back-surface protection material. Therefore, this leads to a reduction in the direct material cost of the solar battery cell as well as providing the effect of reducing the thermal stress during the soldering, which is a recently increased demand in reducing the thickness of a solar battery wafer.

The above solar battery module according to the third embodiment is formed by the collective heat treatment process of simultaneously performing both the step of soldering the interconnectors to the light-receiving-surface collector electrodes and the back-surface collector electrodes and the step of sealing the interconnectors that connect the solar battery cells in series to form the solar battery string. The solar battery module includes the horizontal tab lines 25 that connect, in series, the plurality of solar battery strings disposed in parallel to form the solar battery array, and the output tab lines 26 that take electric power from the solar battery array.

Since the resin sealing is performed simultaneously with the soldering of the interconnectors 20B to the light-receiving-surface bus electrodes 12B and the back-surface joining electrodes 13b, the resin enters in conformity with the peripheral edge of the soldering portion of the interconnectors 20B defined by the twisted wires, such that the interconnectors can be firmly joined to the electrodes. When the interconnectors are soldered to the light-receiving-surface bus electrodes and the back-surface joining electrodes prior to the resin sealing, the interconnector is pressed by a pressing jig such as a clamp and, in some case, a chip crack occurs or a clamp trace remains on the interconnector. In contrast, the method in the first embodiment, which performs the soldering with the opposite surfaces of even a thin solar battery cell protected and pressed, provides not only the improved productivity but also the improved outer appearance free from, for example, chip crack and clamp trace of the interconnector, thereby improving the manufacturing yield.

The method for manufacturing the solar battery module according to the third embodiment comprises providing the solar battery module including the solar battery array and the output tab lines that take, from the solar battery array, electric power collected in the solar battery array. The solar battery array includes the plurality of solar battery strings disposed in parallel, and the bus bars, that is, the horizontal tab lines that connect the plurality of solar battery strings in series. Each of the solar battery strings includes the plurality of solar battery cells and the interconnectors that connect the solar battery cells in series to one another, the interconnectors being solder-coated with the In-based low-melting-point lead-free solder for connecting the solar battery cells to one another therethrough. The method further comprises the lamination step of electrically joining the interconnectors and the bus bars at one time.

According to the method for manufacturing the solar battery module in the third embodiment, the collective heat treatment is performed to thereby carry out the heat treatment step of soldering to the solar battery cell 10 the interconnector 20B defined by the twisted round thin wires together with the resin for sealing. As a result, the heat treatment is applied to the solar battery cell 10 as the solar battery cell 10 is protected by the sealing material. It is thus possible to minimize temperature stress on the solar battery module and improve long-term reliability even if the solar battery cell is thinned.

Note that although the example in which the interconnectors are soldered to the solar battery cells to form the solar battery string has been described in the first to third embodiments, it goes without saying that the present invention is also applicable when the interconnector is used as a wiring material for taking current in one solar battery cell.

The solar battery cell is not limited to the solar battery of the both-surface extraction type used in the first to third embodiments. It goes without saying that the solar battery cell may have only one surface from which to take current, or the current-taken location may be changed to, for example, a corner portion as appropriate. Although the example in which the interconnectors are soldered to the solar battery cells to form the solar battery string, it goes without saying that the present invention is also applicable when the interconnector is used as a wiring material for taking current in one solar battery cell.

Although the crystalline solar battery such as a polycrystal silicon or a single crystal silicon used as the solar battery cell has been described in the first to third embodiments, the present invention is also applicable to non-crystalline solar battery cells such as a thin-film based solar battery and an organic solar battery.

REFERENCE SIGNS LIST 10 solar battery cell
10A light receiving surface
10B rear surface
11 semiconductor substrate
11A light receiving surface
11B rear surface
12 light receiving surface electrode
12G light-receiving-surface grid electrode
12B light-receiving-surface bus electrode
13a rear-surface collector electrode
13b rear-surface joining electrode
20, 20A interconnector
20R bent portion
21 round wire
22 solder layer
23 abutment region
24 inter-element portion
25 horizontal tab line
26 output tab line
31 light-receiving-surface protection material
32 rear-surface protection material
33 light-receiving-surface-side sealing material
34 rear-surface-side sealing material
40 frame
50 solar battery string
70 solar battery array
100 solar battery module
200 heat tool

The invention claimed is:

1. A solar battery module comprising:
a solar battery cell including a semiconductor substrate having pn junction, and a first electrode and a second electrode that are formed on a p-type region and an n-type region of the semiconductor substrate; and
an interconnector including abutment regions abutting on the first electrode and a second electrode of an adjacent solar battery cell, the interconnector connecting the solar battery cell and the adjacent solar battery cell, wherein
the interconnector is a bundle of a plurality of round thin wires, and
the interconnector is larger in width at a connection region of the interconnector than on the solar battery cell, the connection region being connected to a horizontal tab line on an outside of the solar battery cell.

2. A solar battery module comprising:
a solar battery cell including a semiconductor substrate having pn junction, and a first electrode and a second electrode that are formed on a p-type region and an n-type region of the semiconductor substrate; and
an interconnector including abutment regions abutting on the first electrode and a second electrode of an adjacent solar battery cell, the interconnector connecting the solar battery cell and the adjacent solar battery cell, wherein
the interconnector is a bundle of a plurality of round thin wires, and
the plurality of round thin wires of the interconnector located on an outside of the solar battery cell are arranged so that each wire of the plurality of round thin wires are all in one row and connected to a horizontal tab line orthogonal to the interconnector.

3. The solar battery module according to claim 1, wherein
external shapes of the interconnector at the abutment regions abutting on the first electrode and the second electrode are identical in width to the first electrode and the second electrode, and
an external shape of the interconnector at an inter-element portion of the interconnector located between the first electrode and the second electrode of the adjacent solar battery cell has a circular sectional shape.

4. The solar battery module according to claim 2, wherein
external shapes of the interconnector at the abutment regions abutting on the first electrode and the second electrode are identical in width to the first electrode and the second electrode, and
an external shape of the interconnector at an inter-element portion of the interconnector located between the first electrode and the second electrode of the adjacent solar battery cell has a circular sectional shape.

5. The solar battery module according to claim 1, wherein the interconnector is smaller in width at an inter-element portion of the interconnector than on the solar battery cell, the inter-element portion being located between the first electrode and the second electrode of the adjacent solar battery cell.

6. The solar battery module according to claim 2, wherein the interconnector is smaller in width at an inter-element portion of the interconnector than on the solar battery cell, the inter-element portion being located between the first electrode and the second electrode of the adjacent solar battery cell.

7. The solar battery module according to claim 1, wherein, the round thin wires of the interconnector on an outside of the solar battery cell are arranged in one row and connected to a horizontal tab line orthogonal to the interconnector.

8. The solar battery module according to claim 1, wherein the interconnector is formed by a plurality of parallel round thin wires that do not form a twist.

9. The solar battery module according to claim 2, wherein the interconnector is formed by a plurality of parallel round thin wires that do not form a twist.

10. The solar battery module according to claim 1, wherein the interconnector is formed by a plurality of parallel round thin wires that are twisted together.

11. The solar battery module according to claim 2, wherein the interconnector is formed by a plurality of parallel round thin wires that are twisted together.

* * * * *